US010763308B2

(12) United States Patent
Ni et al.

(10) Patent No.: US 10,763,308 B2
(45) Date of Patent: Sep. 1, 2020

(54) DRIVING SUBSTRATE (71) Applicant: E Ink Holdings Inc., Hsinchu (TW)

(72) Inventors: Wei-Shih Ni, Hsinchu (TW); Tai-Kai Chen, Hsinchu (TW); Chia-Hsun Lu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/153,847

(22) Filed: Oct. 8, 2018

(65) Prior Publication Data

US 2019/0123108 A1 Apr. 25, 2019

(30) Foreign Application Priority Data

Oct. 19, 2017 (TW) ............................. 106135801 A (51) Int. Cl.
*H01L 27/28* (2006.01)
*H01L 51/05* (2006.01)
(Continued)

(52) U.S. Cl.
CPC .......... *H01L 27/283* (2013.01); *H01L 23/367* (2013.01); *H01L 23/3737* (2013.01);
(Continued)

(58) Field of Classification Search
CPC ................. H01L 27/283; H01L 51/0541
See application file for complete search history.

(56) References Cited

U.S. PATENT DOCUMENTS 8,569,121 B2    10/2013   Haensch et al.
9,064,748 B2     6/2015   Haensch et al.
(Continued)

FOREIGN PATENT DOCUMENTS

CN    101290964    10/2008
CN    102956711     3/2013
(Continued)

OTHER PUBLICATIONS

Balandin; Alexander A. et al. "Superior Thermal Conductivity of Single-Layer Graphene," Nano Letters, vol. 8, No. 3, Feb. 20, 2008, pp. 902-907.
(Continued)

*Primary Examiner* — Farun Lu
(74) *Attorney, Agent, or Firm* — JCIPRNET (57) ABSTRACT

A driving substrate includes a substrate, a plurality of active devices, a thermal-conducting pattern layer and a buffer layer. The active devices are separately arranged on the substrate. Each active device includes a gate, a channel layer, a gate insulation layer, a source and a drain. The source and the drain expose a portion of the channel layer to define a channel region. The thermal-conducting pattern layer is disposed on the substrate and includes at least one thermal-conducting body and at least one thermal-conducting pattern connected to the thermal-conducting body. The thermal-conducting pattern corresponds to a location of at least one of the channel region, the channel layer, the gate, the source and the drain and each active device. The buffer layer is disposed on the substrate and covers the thermal-conducting pattern layer, and is located between the thermal-conducting pattern and each active device.

15 Claims, 6 Drawing Sheets

(51) Int. Cl.
- *H01L 23/373* (2006.01)
- *H01L 51/10* (2006.01)
- *H01L 23/367* (2006.01)
- *H01L 51/00* (2006.01)

(52) U.S. Cl.
CPC ........ *H01L 51/055* (2013.01); *H01L 51/0516* (2013.01); *H01L 51/0541* (2013.01); *H01L 51/0545* (2013.01); *H01L 51/0558* (2013.01); *H01L 51/102* (2013.01); *H01L 23/373* (2013.01); *H01L 23/3736* (2013.01); *H01L 51/0097* (2013.01)

(56) References Cited

U.S. PATENT DOCUMENTS

| | | |
|---|---|---|
| 9,202,849 B2 | 12/2015 | Lee et al. |
| 9,291,513 B2 | 3/2016 | Lee et al. |
| 2012/0021250 A1 | 1/2012 | Lee et al. |
| 2015/0137092 A1* | 5/2015 | Hsu ...................... H01L 29/495 257/40 |
| 2016/0233144 A1 | 8/2016 | Pae et al. |
| 2019/0006424 A1* | 1/2019 | Kwon ................... H01L 51/055 |

FOREIGN PATENT DOCUMENTS

| | | |
|---|---|---|
| CN | 103904128 | 7/2014 |
| CN | 104576746 | 4/2015 |
| CN | 204694993 | 10/2015 |
| CN | 105552082 | 5/2016 |
| CN | 106783875 | 5/2017 |

OTHER PUBLICATIONS

"Office Action of China Counterpart Application", dated Apr. 24, 2020, p. 1-p. 11.

* cited by examiner

DRIVING SUBSTRATE

CROSS-REFERENCE TO RELATED APPLICATION

This application claims the priority benefit of Taiwan application serial no. 106135801 filed on Oct. 19, 2017. The entirety of the above-mentioned patent application is hereby incorporated by reference herein and made a part of this specification.

BACKGROUND OF THE INVENTION

1. Field of the Invention

The invention relates to a substrate, and particularly relates to a driving substrate.

2. Description of Related Art

Currently, in the application of organic semiconductor materials in organic transistor devices, an organic semiconductor channel layer is formed by film crystallization. Generally speaking, in film crystallization through a solution process adopting an organic solvent, crystallization is mostly generated by heating. However, as the temperature requirement for the uniformity of crystallization of the organic semiconductor channel layer is demanding, a main factor influencing the condition of crystallization of the organic semiconductor channel layer is the uniformity of heating during crystallization.

A conventional heating process for crystallization of the organic semiconductor is to heat a bottom substrate by using a platen heater, where the heat is transferred to the organic semiconductor channel layer for crystallization through heat conduction. However, a plastic substrate is unable to uniformly transfer heat to the whole substrate within a short period of time when the plastic substrate contacts the platen heater. Therefore, organic semiconductor channel layers separately disposed on the substrate have different heating rates. As a result, crystallization speeds of the organic semiconductor channel layers are different. In other words, the conventional process is unable to effectively control the consistency across crystalline structures of the respective channel layers. Consequently, the chance of electrical anomaly in a transistor device is increased.

SUMMARY OF THE INVENTION

The embodiments of the invention provides a driving substrate capable of reducing the chance of electrical anomaly of an active device.

A driving substrate according to an embodiment of the invention includes a substrate, a plurality of active devices, a thermal-conducting pattern layer and a buffer layer. The active devices are separately arranged on the substrate, and each of the active devices includes a gate, a channel layer, a gate insulation layer, and a source and a drain. The gate insulation layer is disposed between the gate and the channel layer. The source and a drain are disposed on the same surface of the channel layer and expose a portion of the channel layer to define a channel region. The thermal-conducting pattern layer is disposed on the substrate and includes at least one thermal-conducting body and at least one thermal-conducting pattern connected the thermal-conducting body. The thermal-conducting pattern corresponds to a location of at least one of the channel region, the channel layer, the gate, the source and the drain and each active device. The buffer layer is disposed on the substrate and covers the thermal-conducting pattern layer, and is located between the thermal-conducting pattern and each active device.

According to an embodiment of the invention, an orthogonal projection of the thermal-conducting body on the substrate is not overlapped with an orthogonal projection of each of the active devices on the substrate.

According to an embodiment of the invention, the thermal-conducting pattern and the buffer layer are located on the substrate, the source and the drain are located between the gate insulation layer and the buffer layer, and the channel layer is located between the gate and the buffer layer.

According to an embodiment of the invention, an orthogonal projection of the thermal-conducting pattern on the substrate is overlapped with an orthogonal projection of the channel region of the channel layer on the substrate, and an area of the orthogonal projection of the channel region on the substrate is greater than or equal to an area of the orthogonal projection of the thermal-conducting pattern on the substrate.

According to an embodiment of the invention, an orthogonal projection of the thermal-conducting pattern on the substrate is overlapped with an orthogonal projection of the channel layer on the substrate, and an area of the orthogonal projection of the channel layer on the substrate is greater than or equal to an area of the orthogonal projection of the thermal-conducting pattern on the substrate.

According to an embodiment of the invention, an orthogonal projection of the thermal-conducting pattern on the substrate is overlapped with orthogonal projections of the source and the drain on the substrate.

According to an embodiment of the invention, an orthogonal projection of the thermal-conducting pattern on the substrate is overlapped with an orthogonal projection of each of the active devices on the substrate.

According to an embodiment of the invention, the thermal-conducting pattern and the buffer layer are located on the substrate, the gate is located between the gate insulation layer and the buffer layer, and the source and the drain and the channel layer are located on the gate insulation layer.

According to an embodiment of the invention, an orthogonal projection of the thermal-conducting pattern on the substrate is overlapped with an orthogonal projection of the gate on the substrate.

According to an embodiment of the invention, an orthogonal projection of the thermal-conducting pattern on the substrate is overlapped with an orthogonal projection of the channel layer on the substrate.

According to an embodiment of the invention, an orthogonal projection of the thermal-conducting pattern on the substrate is overlapped with an orthogonal projection of each of the active devices on the substrate.

According to an embodiment of the invention, the substrate is a flexible base material, a material of the channel layer includes an organic semiconductor material, and a material of the buffer layer includes an organic insulating material.

According to an embodiment of the invention, a material of at least one of the gate, the source, and the drain includes an organic, electrically conductive material.

According to an embodiment of the invention, a material of the thermal-conducting pattern layer includes graphene, silver, or copper.

A driving substrate according to an embodiment of the invention includes a substrate, a plurality of active devices, a thermal-conducting pattern layer and a buffer layer. The active devices are separately arranged on the substrate, and each of the active devices includes a gate, a channel layer, a gate insulation layer, and a source and a drain. The gate insulation layer is disposed between the gate and the channel layer. The source and a drain are disposed on the same surface of the channel layer and expose a portion of the channel layer to define a channel region. The thermal-conducting pattern layer is disposed on the substrate and includes at least one thermal-conducting body and at least one thermal-conducting pattern connected the thermal-conducting body. An orthogonal projection of the thermal-conducting body on the substrate is not overlapped with an orthogonal projection of each of the active devices on the substrate. The buffer layer is disposed on the substrate and covers the thermal-conducting pattern layer, and is located between the thennal-conducting pattern and each active device.

According to an embodiment of the invention, the thermal-conducting pattern corresponds to a location of each of the active devices.

Based on the above, in the design of the driving substrate according to the embodiments of the invention, the thermal-conducting pattern of the thermal-conducting pattern layer corresponds to the location of at least one of the channel region, the channel layer, the gate, the source and the drain, and the active device. With the thermal-conducting pattern, the heat can be rapidly and uniformly transferred to the corresponding location. Accordingly, the device properties of the active devices of the driving substrate according to the embodiments of the invention are more consistent. Besides, the chance of electrical anomaly of the active devices is reduced, and the active devices may exhibit a desirable quality.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
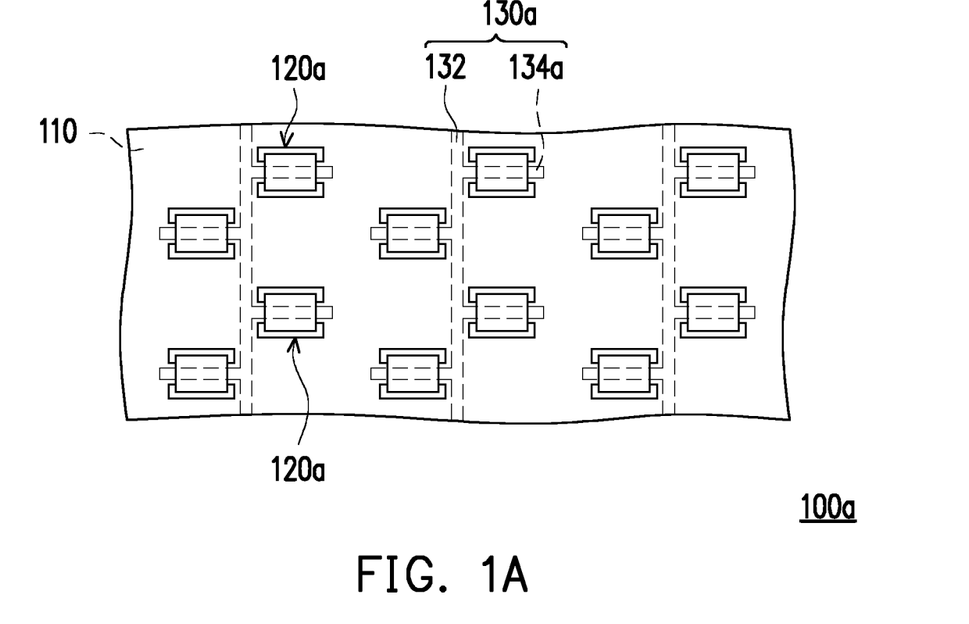
FIG. 1A is a partial schematic top view illustrating a driving substrate according to an embodiment of the invention.
Figure 1B:
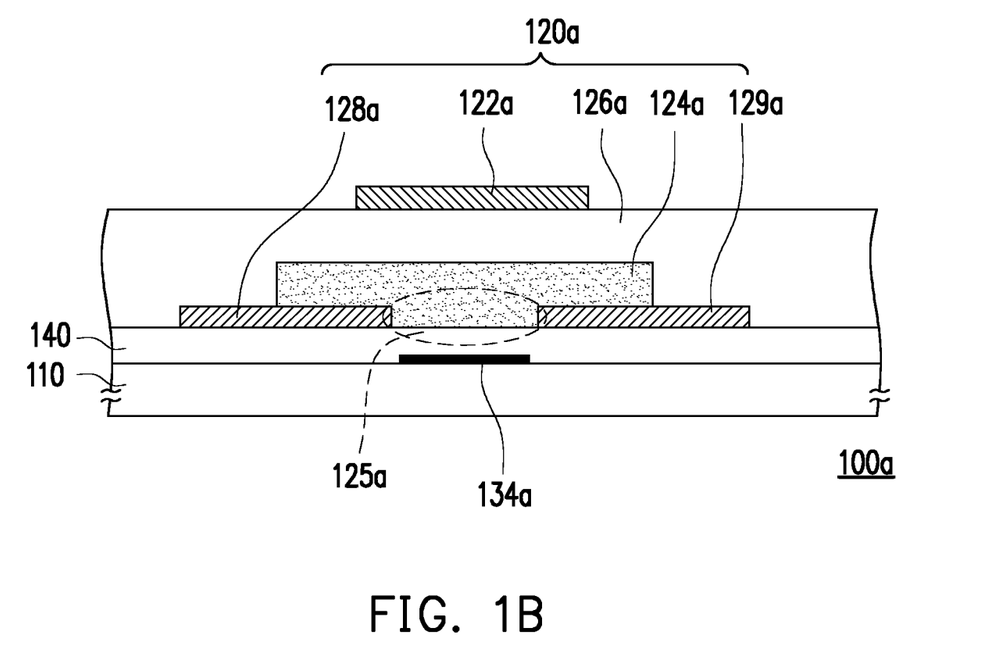
FIG. 1B is a partial schematic cross-sectional view illustrating the driving substrate of FIG. 1A.

FIG. 1A is a partial schematic top view illustrating a driving substrate according to an embodiment of the invention. FIG. 1B is a partial schematic cross-sectional view illustrating the driving substrate of FIG. 1A. For the ease of illustration, some components, such as the gate, are omitted from FIG. 1A. Referring to FIGS. 1A and 1B, in the embodiment, a driving substrate 100a includes a substrate 110, a plurality of active devices 120a, a thermal-conducting layer 130a, and a buffer layer 140. The active devices 120a are separately arranged on the substrate 110, and each of the active devices 120a includes a gate 122a, a channel layer 124a, a gate insulation layer 126a, and a source 128a and a drain 129a. The gate insulation layer 126a is disposed between the gate 122a and the channel layer 124a. The source 128a and the drain 129a are disposed on the same surface of the channel layer 124a. In addition, the source 128a and the drain 129a expose a portion of the channel layer 124a to define a channel region 125a. The thermal-conducting pattern layer 130a is disposed on the substrate 110 and includes at least one thermal-conducting body 132 and at least one thermal-conducting pattern 134a connected to the thermal-conducting body 132. The thermal-conducting pattern 134a corresponds to a location of at least one of the channel region 125a, the channel layer 124a, the gate 122a, the source 128a and the drain 129a and each of the active devices 120a. The buffer layer 140 is disposed on the substrate 110 and covers the thermal-conducting pattern layer 130a, and is located between the thermal-conducting pattern 134a and each of the active devices 120a.

Specifically, a flexible substrate may be implemented as the substrate 110 of the embodiment, and a material of the substrate 110 may include a plastic material, for example. Nevertheless, the invention is not limited thereto. As shown in FIG. 1A, the active devices 120a of the embodiment are separately arranged on the substrate 110 and located on two opposite sides of the thermal-conducting body 132. In addition, the respective active devices 120a are sequentially and alternately arranged on two opposite sides of each thermal-conducting body 132, and each of the active devices 120a corresponds to one thermal-conducting pattern 134a. In other words, in the embodiment, an orthogonal projection of the thermal-conducting body 132 on the substrate 110 is not overlapped with orthogonal projections of the active devices 120a on the substrate 110. Of course, in other embodiments not shown herein, the active devices 120a may also be symmetrically disposed on the two opposite sides of the thermal-conducting body 132. Alternatively, the active devices 120a may be disposed on only one side of the thermal-conducting body 132. Besides, the shape of the thermal-conducting body 132 is not limited to the illustration of the embodiment. The scope of the invention is determined by the claims annexed below.

As shown in FIG. 1B, in the embodiment, the thermal-conducting pattern 134a and the buffer layer 140 are located on the substrate 110, and the source 128a and the drain 129a are located between the gate insulation layer 126a and the buffer layer 140. In addition, the channel layer 124a is located between the gate 122a and the buffer layer 140. Herein, the material of the channel layer 124a may include an organic semiconductor material. In other words, a top gate organic thin-film transistor (top gate OTFT) may be implemented as the active device 120a of the embodiment. In addition, the materials of the gate 122a, the source 128a, and the drain 129a of the embodiment may include a metal material or an organic, electrically conductive material, for example. The invention does not intend to impose a limitation on this regard.

Particularly, the thermal-conducting pattern 134a of the embodiment corresponds to the channel region 125a. In addition, an orthogonal projection of the thermal-conducting pattern 134a on the substrate 110 is overlapped with an orthogonal projection of the channel region 125a of the channel layer 124a on the substrate 110. Moreover, an area of the orthogonal projection of the channel region 125a on the substrate 110 is greater than or equal to an area of the orthogonal projection of the thermal-conducting pattern 134a on the substrate 110. The material of the thermal-conducting pattern layer 130a includes graphene (a conductive coefficient thereof is 5300 W/mk), silver (a conductive coefficient thereof is 420 W/mk), or copper (a conductive coefficient thereof is 401 W/mk), for example. Compared with the material of the substrate 110 (such as a plastic material whose conductive coefficient ranges from 0.1 W/mk to 0.5 W/mk) or the organic material of the active device 120a whose conductive coefficient ranges from 1 W/mk to 10 W/mk, the thermal-conducting capability of the thermal-conducting pattern layer 130a is at least ten times more, and the thermal-conducting pattern layer 130a has a desirable flexibility. The material of the buffer layer 140 includes an organic insulating material capable of effectively electrically isolating the thermal-conducting pattern 134a from the source 128a and the drain 129a.

In the embodiment, the thermal-conducting pattern 134a is disposed in correspondence with the location of the channel region 125a. Therefore, when the substrate 110 is being heated, the thermal-conducting pattern layer 130a is able to transfer the heat to the substrate 110. In addition, with the thermal-conducting pattern 134a, the heat can be rapidly and uniformly transferred to the corresponding location. As a result, the crystallization uniformity among the corresponding locations is able to be facilitated. Moreover, with the thermal-conducting pattern 134a and the thermal-conducting body 132 connected with the thermal-conducting pattern 134a, the heat may be transferred to the whole substrate 110. In addition, the thermal-conducting body 132 may be flexible. Nevertheless, the invention is not limited thereto. Therefore, the channel regions 125a of the active devices 120a of the driving substrate 100a of the embodiment have a more consistent heating uniformity. Moreover, the active devices 120a have a reduced chance of electrical anomaly and exhibit a desirable quality.

It should be noted that the reference numerals and a part of the contents in the previous embodiment are used in the following embodiments, in which identical reference numerals indicate identical or similar components, and repeated description of the same technical contents may be referred to the foregoing and thus will not be repeated in the following.

Figure 2A:
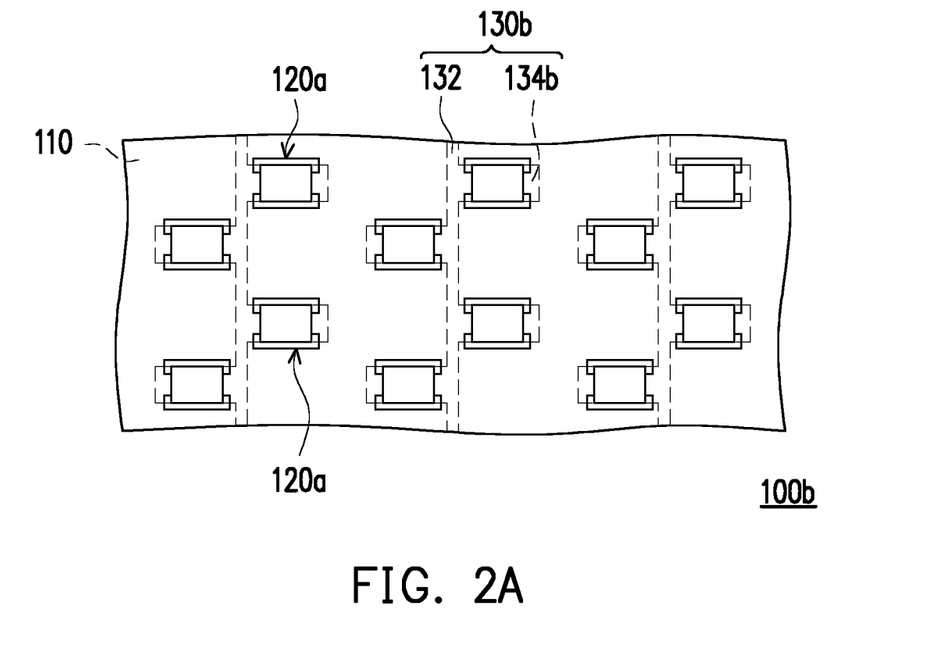
FIG. 2A is a partial schematic top view illustrating a driving substrate according to another embodiment of the invention.
Figure 2B:
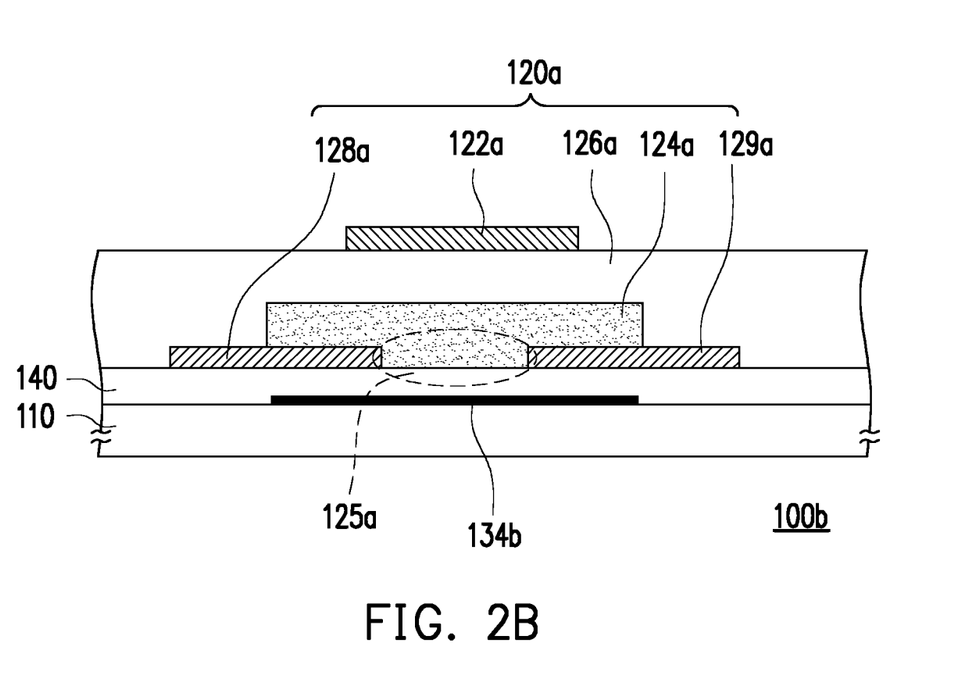
FIG. 2B is a partial schematic cross-sectional view illustrating the driving substrate of FIG. 2A.

FIG. 2A is a partial schematic top view illustrating a driving substrate according to another embodiment of the invention. FIG. 2B is a partial schematic cross-sectional view illustrating the driving substrate of FIG. 2A. For the ease of illustration, some components, such as the gate, are omitted from FIG. 2A. Referring to FIGS. 1A, 1B, 2A, and 2B, a driving substrate 100b of the embodiment is similar to the driving substrate 100a of FIGS. 1A and 1B, except for a main difference that a thermal-conducting pattern 134b of a thermal-conducting pattern layer 130b of the embodiment is disposed in correspondence with the location of the channel layer 124a. In addition, an orthogonal projection of the thermal-conducting pattern 134b of the driving substrate 100b on the substrate 110 is overlapped with an orthogonal projection of the channel layer 124a on the substrate 110, an area of the orthogonal projection of the channel layer 124a on the substrate 110 is greater than or equal to an area of the orthogonal projection of the thermal-conducting pattern 134b on the substrate 110, and an area of an orthogonal projection of the channel region 125a on the substrate 110 is smaller than the area of the orthogonal projection of the thermal-conducting pattern 134b on the substrate 110. Since the thermal-conducting pattern 134b is disposed in correspondence with the location of the channel layer 124a, the thermal-conducting pattern 134b may facilitate a thermal-conducting rate of the channel layer 124a. As a consequence, the heating uniformity among the channel layers 124a of the active devices 120a is facilitated.

Figure 3A:
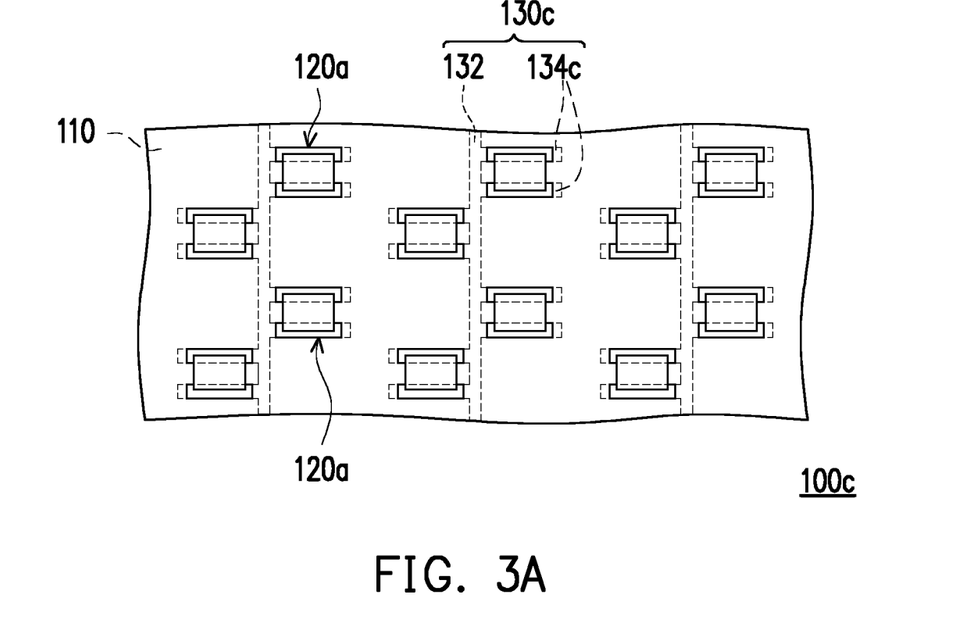
FIG. 3A is a partial schematic top view illustrating a driving substrate according to another embodiment of the invention.
Figure 3B:
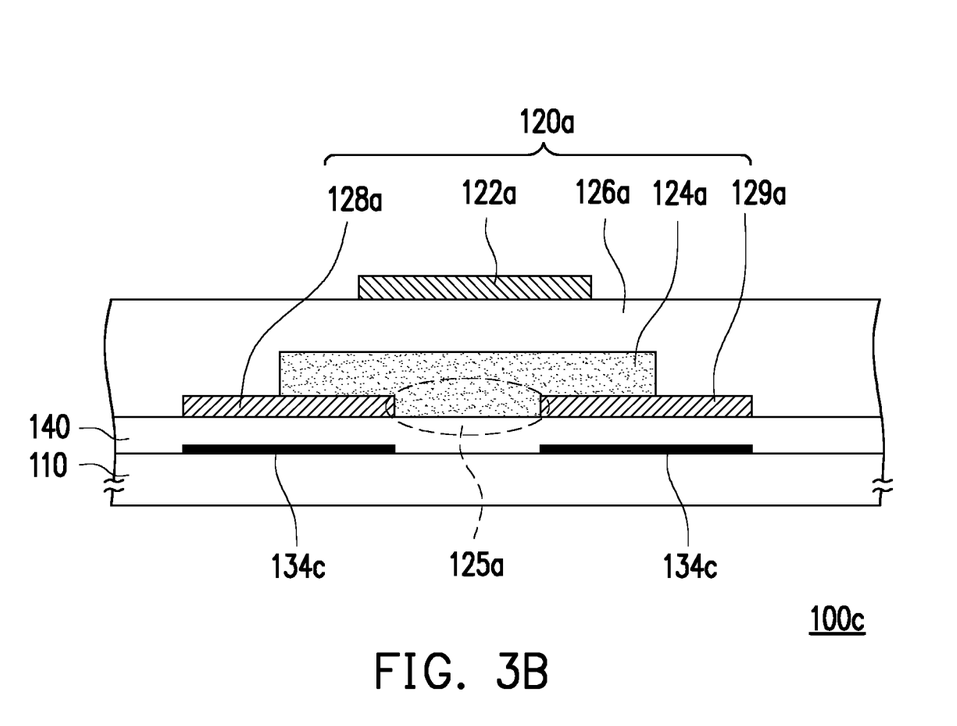
FIG. 3B is a partial schematic cross-sectional view illustrating the driving substrate of FIG. 3A.

FIG. 3A is a partial schematic top view illustrating a driving substrate according to another embodiment of the invention. FIG. 3B is a partial schematic cross-sectional view illustrating the driving substrate of FIG. 3A. For the ease of illustration, some components, such as the gate, are omitted from FIG. 3A. Referring to FIGS. 1A, 1B, 3A, and 3B, a driving substrate 100c of the embodiment is similar to the driving substrate 100a shown in FIGS. 1A and 1B, except for a main difference that the material of the source 128a and the drain 129a of the embodiment includes an organic, electrically conductive material. In the embodiment, a thermal-conducting pattern 134c of a thermal-conducting pattern layer 130c is disposed in correspondence with the locations of the source 128a and the drain 129a. In addition, an orthogonal projection of the thermal-conducting pattern 134c of the driving substrate 100c on the substrate 110 is overlapped with orthogonal projections of the source 128a and the drain 129a on the substrate 110. In an embodiment, an area of the orthogonal projections of the source 128a and the drain 129a on the substrate 110 is greater than or equal to an area of the orthogonal projection of the thermal-conducting pattern 134c on the substrate 110. However, in another embodiment, the area of the orthogonal projections of the source 128a and the drain 129a on the substrate 110 may also be smaller than the area of the orthogonal projection of the thermal-conducting pattern 134c on the substrate 110. In the embodiment, the thermal-conducting pattern 134c is disposed in correspondence with the locations of the source 128a and the drain 129a. Therefore, the thermal-conducting pattern 134c may facilitate a thermal-conducting rate of the source 128a and the drain 129a. As a consequence, the heating uniformity among the sources 128a and the drains 129a of the active devices 120a is facilitated.

Figure 4A:
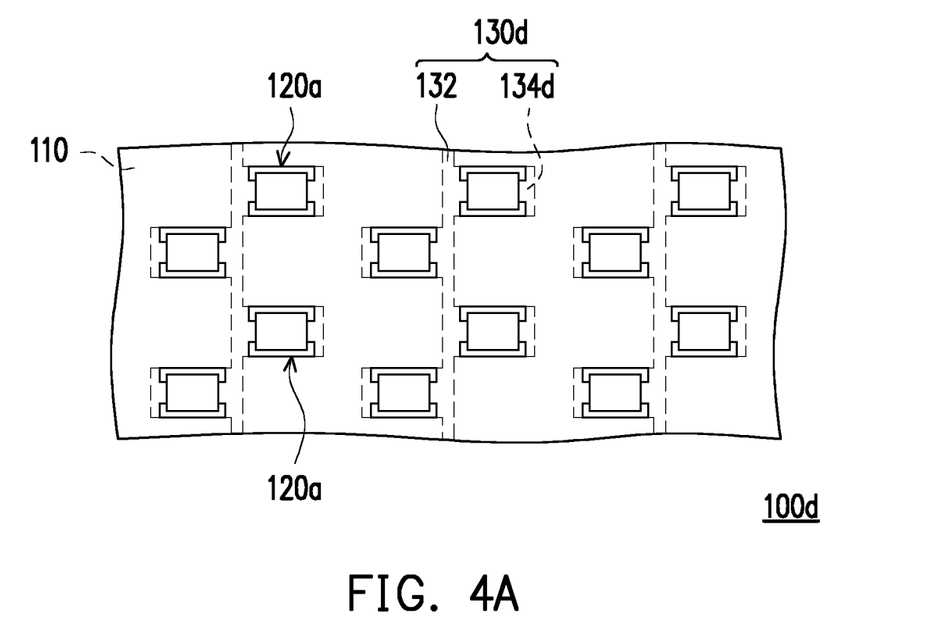
FIG. 4A is a partial schematic top view illustrating a driving substrate according to another embodiment of the invention.
Figure 4B:
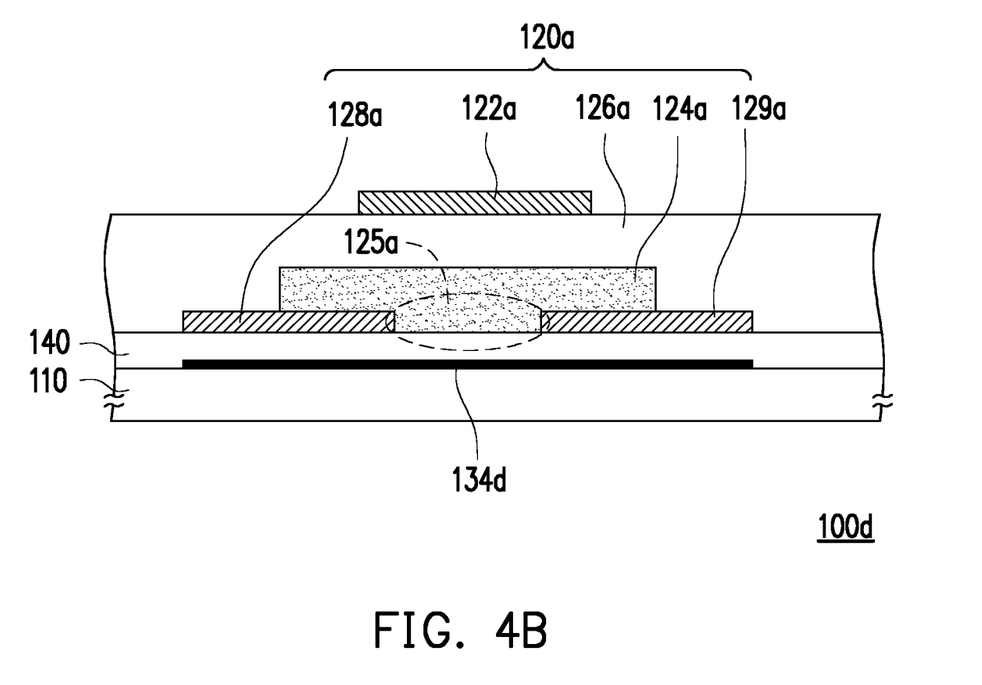
FIG. 4B is a partial schematic cross-sectional view illustrating the driving substrate of FIG. 4A.

FIG. 4A is a partial schematic top view illustrating a driving substrate according to another embodiment of the invention. FIG. 4B is a partial schematic cross-sectional view illustrating the driving substrate of FIG. 4A. For the ease of illustration, some components, such as the gate, are omitted from FIG. 4A. Referring to FIGS. 1A, 1B, 4A, and 4B, a driving substrate 100d of the embodiment is similar to the driving substrate 100a shown in FIGS. 1A and 1B, except for a main difference that the material of the gate 122a, the source 128a and the drain 129a of the active device 120a in the embodiment includes an organic, electrically conductive material. In the embodiment, a thermal-conducting pattern 134d of a thermal-conducting pattern layer 130d is disposed in correspondence with the location of each of the active devices 120a. In addition, an orthogonal projection of the thermal-conducting pattern 134d of the driving substrate 100d on the substrate 110 is overlapped with an orthogonal projection of each of the active devices 120a on the substrate 110. In an embodiment, an area of the orthogonal projection of each of the active devices 120a on the substrate 110 is greater than or equal to an area of the orthogonal projection of the thermal-conducting pattern 134d on the substrate 110. However, in another embodiment, the area of the orthogonal projection of the active device 120a on the substrate 110 may be smaller than the area of the orthogonal projection of the thermal-conducting pattern 134d on the substrate 110. Since the thermal-conducting pattern 134d is disposed in correspondence with the location of the active device 120a, the thermal-conducting pattern 134d may facilitate a thermal-conducting rate of the active device 120a. As a consequence, the heating uniformity among the active devices 120a is facilitated.

Figure 5A:
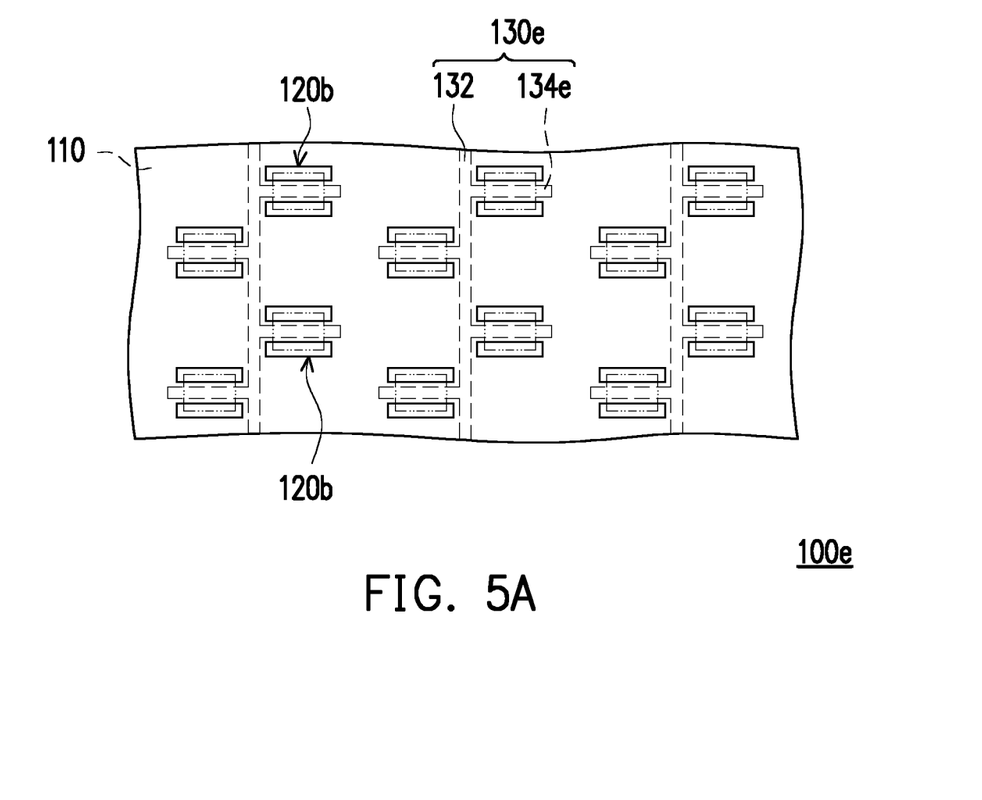
FIG. 5A is a partial schematic top view illustrating a driving substrate according to another embodiment of the invention.
Figure 5B:
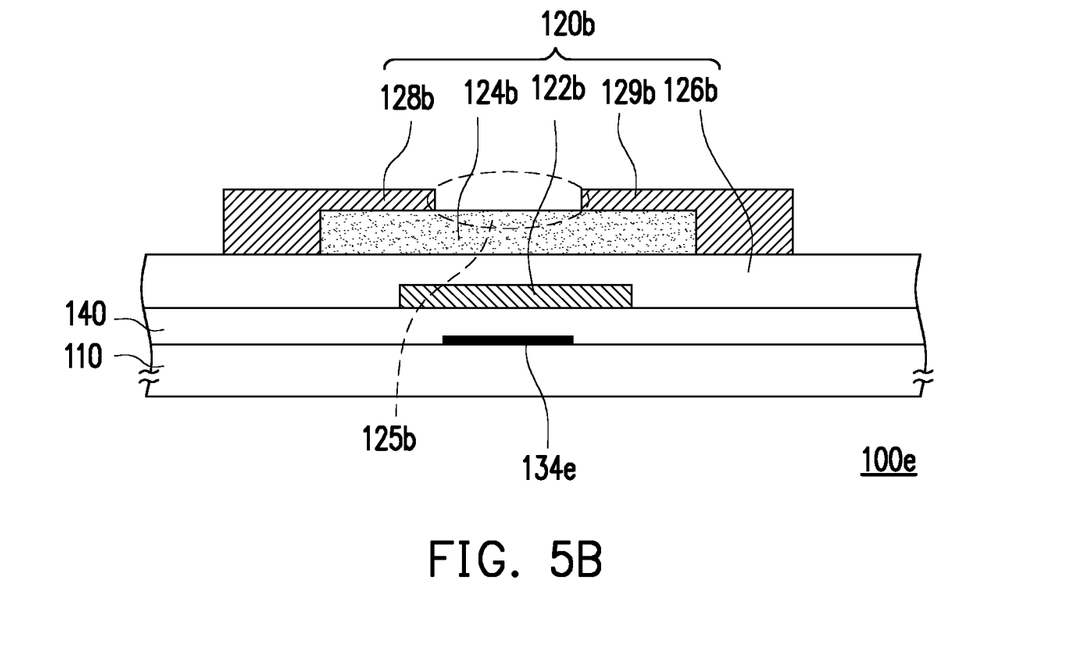
FIG. 5B is a partial schematic cross-sectional view illustrating the driving substrate of FIG. 5A.

FIG. 5A is a partial schematic top view illustrating a driving substrate according to another embodiment of the invention. FIG. 5B is a partial schematic cross-sectional view illustrating the driving substrate of FIG. 5A. For the ease of illustration, some components, such as the gate, are omitted from FIG. 5A. Referring to FIGS. 1A, 1B, 5A, and 5B, a driving substrate 100e of the embodiment is similar to the driving substrate 100a of FIGS. 1A and 1B, except for a main difference that the material of a channel layer 124b of an active device 120b of the embodiment includes an organic semiconductor material, and a bottom gate organic thin-film transistor (bottom gate OTFT) is implemented as the active device 120b. In addition, a thermal-conducting pattern 134e of a thermal-conducting pattern layer 130e and the buffer layer 140 are located on the substrate 110, a gate 122b is located on the buffer layer 140 and between a gate insulation layer 126b and the buffer layer 140, and a source 128b, a drain 129b, and the channel layer 124b are located on the gate insulation layer 126b. In the embodiment, the material of the gate 122b includes an organic, electrically conductive material.

As shown in FIG. 5B, the thermal-conductive pattern 134e of the thermal-conducting pattern layer 130e of the embodiment is disposed in correspondence with the location of the gate 122b. An orthogonal projection of the thermal-conducting pattern 134e of the driving substrate 100e on the substrate 110 is overlapped with an orthogonal projection of the gate 122b on the substrate 110, and an area of the orthogonal projection of the gate 122b on the substrate 110 is greater than or equal to an area of the orthogonal projection of the thermal-conducting pattern 134e on the substrate 110. Since the thermal-conducting pattern 134e is disposed in correspondence with the location of the gate 122b, the thermal-conducting pattern 134e may facilitate a thermal-conducting rate of the gate 122b. As a consequence, the heating uniformity among the gates 122b of the active devices 120b is facilitated.

Figure 6:
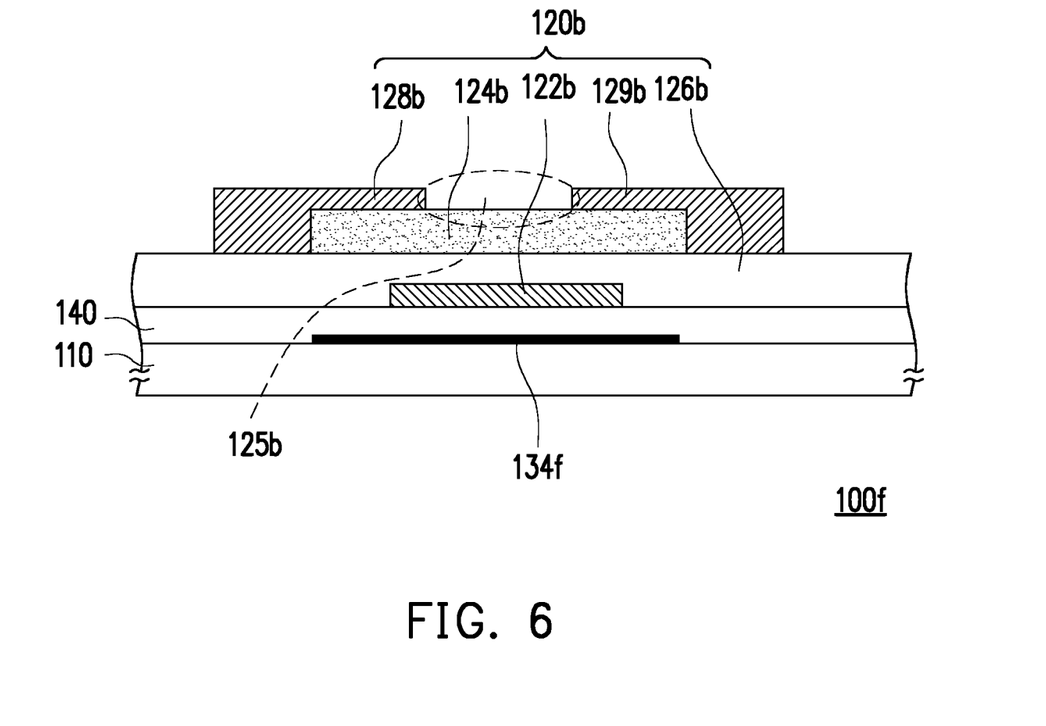
FIG. 6 is a partial schematic cross-sectional view illustrating a driving substrate according to another embodiment of the invention.

FIG. 6 is a partial schematic cross-sectional view illustrating a driving substrate according to another embodiment of the invention. A difference between a driving substrate 100f of the embodiment and the driving substrate 100e of FIGS. 5A and 5B is that a thermal-conducting pattern 134f of the embodiment is disposed in correspondence with the location of the channel layer 124b. In addition, an orthogonal projection of the thermal-conducting pattern 134f of the driving substrate 100f on the substrate 110 is overlapped with an orthogonal projection of the channel layer 124b on the substrate 110, an area of the orthogonal projection of the channel layer 124b on the substrate 110 is greater than or equal to an area of the orthogonal projection of the thermal-conducting pattern 134f on the substrate 110, and an area of an orthogonal projection of a channel region 125b on the substrate 110 is smaller than the area of the orthogonal projection of the thermal-conducting pattern 134f on the substrate 110.

Figure 7:
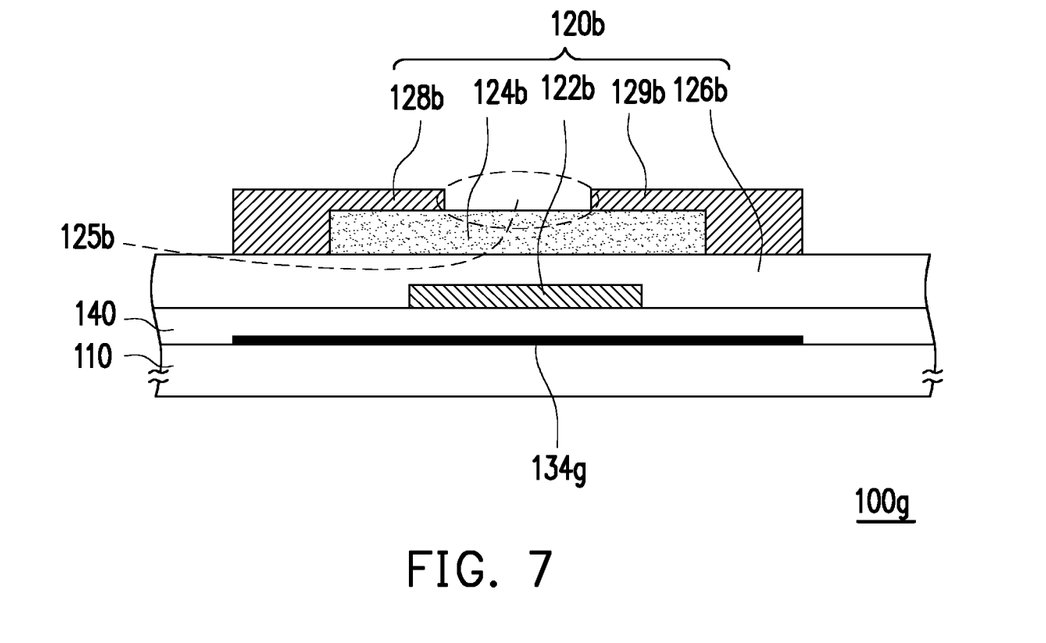
FIG. 7 is a partial schematic cross-sectional view illustrating a driving substrate according to another embodiment of the invention.

FIG. 7 is a partial schematic cross-sectional view illustrating a driving substrate according to another embodiment of the invention. A difference between a driving substrate 100g of the embodiment and the driving substrate 100e in FIGS. 5A and 5B is that the material of the gate 122b, the source 128b, and the drain 129b of the active device 120b of the embodiment includes an organic, electrically conductive material. In the embodiment, a thermal-conducting pattern 134g is disposed in correspondence with the location of each of the active devices 120b. In addition, an orthogonal projection of the thermal-conducting pattern 134g of the driving substrate 100g on the substrate 110 is overlapped with an orthogonal projection of each of the active devices 120b on the substrate 110. In an embodiment, an area of the orthogonal projection of each of the active devices 120b on the substrate 110 is greater than or equal to an area of the orthogonal projection of the thermal-conducting pattern 134g on the substrate 110. However, in another embodiment, the area of the orthogonal projection of the active device 120b on the substrate 110 may also be smaller than the area of the orthogonal projection of the thermal-conducting pattern 134g on the substrate 110. Since the thermal-conducting pattern 134g is disposed in correspondence with the location of the active device 120b, the thermal-conducting pattern 134d may facilitate a thermal-conducting rate of the active device 120b. As a consequence, the heating uniformity among the active devices 120b is facilitated.

In view of the foregoing, since the thermal-conducting pattern according to the embodiments of the invention has the thermal-conducting body and the thermal-conducting pattern connected to the thermal-conducting body, and the thermal-conducting pattern corresponds to the location of at least one of the channel region, the channel layer, the gate, the source and the drain, and each of the active devices, with the thermal-conducting pattern, the heat can be rapidly and uniformly transferred to the corresponding location. Therefore, the thermal-conducting pattern is able to effectively facilitate the heating uniformity among the corresponding locations. In addition, with the thermal-conducting pattern and the thermal-conducting body connected to the thermal-conducting pattern, the heat may be transferred to the whole substrate. Consequently, the heating uniformity among the respective active devices on the driving substrate according to the embodiments of the invention is more consistent, and the active devices thus have a reduced chance of electrical anomaly and may exhibit a desirable quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driving substrate, comprising:
   a substrate;
   a plurality of active devices, separately arranged on the substrate, wherein each of the active devices comprises:
      a gate;
      a channel layer;
      a gate insulation layer, disposed between the gate and the channel layer; and
      a source and a drain, disposed on the same surface of the channel layer, wherein the source and the drain expose a portion of the channel layer to define a channel region;
   a thermal-conducting pattern layer, disposed on the substrate and comprising at least one thermal-conducting body and at least one thermal-conducting pattern connected to the thermal-conducting body, wherein the thermal-conducting pattern corresponds to a location of at least one of the channel region, the channel layer, the gate, the source, and the drain, wherein an orthogonal projection of the thermal-conducting body on the substrate is not overlapped with an orthogonal projection of each of the active devices on the substrate; and
   a buffer layer, disposed on the substrate, covering the thermal-conducting pattern layer, and located between the thermal-conducting pattern and each of the active devices.

2. The driving substrate as claimed in claim 1, wherein the thermal-conducting pattern and the buffer layer are located on the substrate, the source and the drain are located between the gate insulation layer and the buffer layer, and the channel layer is located between the gate and the buffer layer.

3. The driving substrate as claimed in claim 2, wherein an orthogonal projection of the thermal-conducting pattern on the substrate is overlapped with an orthogonal projection of the channel region of the channel layer on the substrate, and an area of the orthogonal projection of the channel region on the substrate is greater than or equal to an area of the orthogonal projection of the thermal-conducting pattern on the substrate.

4. The driving substrate as claimed in claim 2, wherein an orthogonal projection of the thermal-conducting pattern on the substrate is overlapped with an orthogonal projection of the channel layer on the substrate, and an area of the orthogonal projection of the channel layer on the substrate is greater than or equal to an area of the orthogonal projection of the thermal-conducting pattern on the substrate.

5. The driving substrate as claimed in claim 2, wherein an orthogonal projection of the thermal-conducting pattern on the substrate is overlapped with orthogonal projections of the source and the drain on the substrate.

6. The driving substrate as claimed in claim 2, wherein an orthogonal projection of the thermal-conducting pattern on the substrate is overlapped with an orthogonal projection of each of the active devices on the substrate.

7. The driving substrate as claimed in claim 1, wherein the thermal-conducting pattern and the buffer layer are located on the substrate, the gate is located between the gate insulation layer and the buffer layer, and the source and the drain and the channel layer are located on the gate insulation layer.

8. The driving substrate as claimed in claim 7, wherein an orthogonal projection of the thermal-conducting pattern on the substrate is overlapped with an orthogonal projection of the gate on the substrate.

9. The driving substrate as claimed in claim 7, wherein an orthogonal projection of the thermal-conducting pattern on the substrate is overlapped with an orthogonal projection of the channel layer on the substrate.

10. The driving substrate as claimed in claim 7, wherein an orthogonal projection of the thermal-conducting pattern on the substrate is overlapped with an orthogonal projection of each of the active devices on the substrate.

11. The driving substrate as claimed in claim 1, wherein the substrate is a flexible base material, a material of the channel layer comprises an organic semiconductor material, and a material of the buffer layer comprises an organic insulating material.

12. The driving substrate as claimed in claim 11, wherein a material of at least one of the gate, the source, and the drain comprises an organic, electrically conductive material.

13. The driving substrate as claimed in claim 1, wherein a material of the thermal-conducting pattern layer comprises graphene, silver, or copper.

14. A driving substrate, comprising:
   a substrate;
   a plurality of active devices, separately arranged on the substrate, wherein each of the active devices comprises:
      a gate;
      a channel layer;
      a gate insulation layer, disposed between the gate and the channel layer; and
      a source and a drain, disposed on the same surface of the channel layer, wherein the source and the drain expose a portion of the channel layer to define a channel region;
   a thermal-conducting pattern layer, disposed on the substrate and comprising at least one thermal-conducting body and at least one thermal-conducting pattern connected to the thermal-conducting body, wherein an orthogonal projection of the thermal-conducting body on the substrate is not overlapped with an orthogonal projection of each of the active devices on the substrate; and
   a buffer layer, disposed on the substrate, covering the thermal-conducting pattern layer, and located between the thermal-conducting pattern and each of the active devices.

15. The driving substrate as claimed in claim 14, wherein the thermal-conducting pattern corresponds to a location of each of the active devices.

* * * * *